Figure 1:
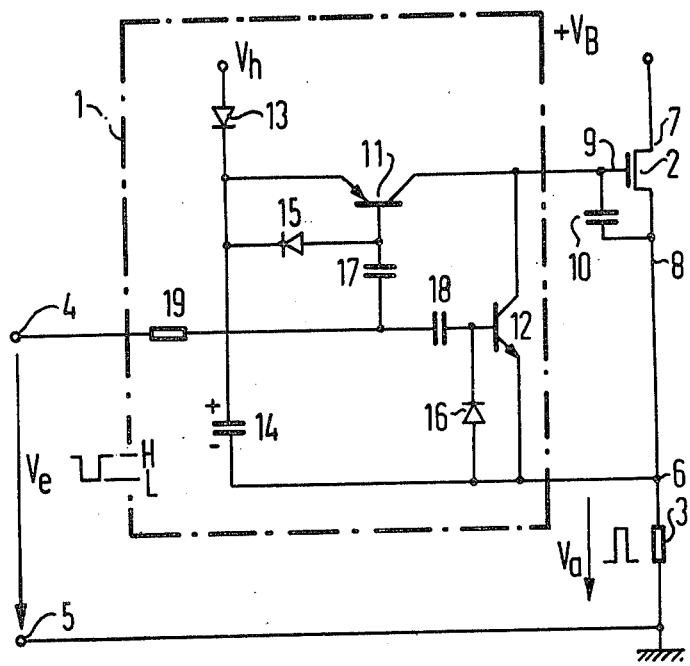

United States Patent [19]

Hebenstreit

[11] 4,430,586
[45] Feb. 7, 1984

[54] SWITCH WITH AN MIS-FET OPERATED AS A SOURCE FOLLOWER

[75] Inventor: Ernst Hebenstreit, Munich, Fed. Rep. of Germany

[73] Assignee: Siemens Aktiengesellschaft, Berlin and Munich, Fed. Rep. of Germany

[21] Appl. No.: 262,648

[22] Filed: May 11, 1981

[30] Foreign Application Priority Data

May 14, 1980 [DE] Fed. Rep. of Germany ....... 3018501

[51] Int. Cl.³ .................... H03K 17/12; H03K 17/56; H03K 17/687
[52] U.S. Cl. ................................. 307/570; 307/575; 307/584; 307/578; 307/264; 307/270; 307/482
[58] Field of Search ............ 307/570, 571, 575, 577, 307/270, 252 R, 252 C, 252 A, 574, 578; 330/9, 262, 51

[56] References Cited

FOREIGN PATENT DOCUMENTS 56-31227  3/1981  Japan .................................. 307/571

OTHER PUBLICATIONS

Jenkins, "Interface Circuits Drive High Level Switches from Low-Level Inputs", Electronic Engineering, pp. 45-49, May, 1971.

Hebenstreit, "Driving the SIPMOS Field Effect Transistor as a fast Power Switch", Siemens Forsch.-u. Entwickl-Ber, pp. 200-204, 5/80.

Siliconix, "VMOS Power FETs Design Catalog", pp. 4-6, Jan. 1979.

*Primary Examiner*—Larry N. Anagnos
*Assistant Examiner*—David R. Bertelson
*Attorney, Agent, or Firm*—Herbert L. Lerner; Laurence A. Greenberg

[57] ABSTRACT

A switch includes an MIS-FET having a source and a control electrode defining a gate-source capacitance and being operated as a source follower for switching a given voltage, a first capacitor, a first auxiliary transistor and a second auxiliary transistor cutting off the first transistor when switched into a conducting state. The transistors each have a base, a collector and an emitter electrode defining a switching path. The collectors of each of the transistors are connected to the control electrode of the FET. A control input terminal is provided as well as second and third capacitors each being connected between the control input terminal and the base of a respective one of the transistors. The emitter electrode of the second transistor is connected to the source electrode of the FET. The first capacitor has one lead connected to the emitter electrode of the second transistor and to the source electrode of the FET for charging the gate-source capacitance of the FET through the switching path of the first transistor, and another lead connected to the emitter electrode of the first transistor and to a terminal of a voltage source having a lower voltage than the given voltage to be switched by the FET for charging the first capacitor when the first transistor is cut off.

7 Claims, 2 Drawing Figures

SWITCH WITH AN MIS-FET OPERATED AS A SOURCE FOLLOWER

The invention relates to a switch with an MIS-FET operated as a source follower, a capacitor which is connected, with one of its leads, to the source electrode of the FET and can charge the gatesource capacitance of the FET through the switching path of a first auxiliary transistor, wherein the capacitor can be connected with its other lead through a diode to one terminal of a voltage source in such a manner that it is charged if the first auxiliary transistor is cut off, and a second auxiliary transistor being provided which cuts off the first auxiliary transistor upon opening.

Such a switch has been described, for instance, in "VMOS Power FETs Design Catalog", January 1979, FIG. 20, of the firm Siliconix. In this switch, two auxiliary npn-transistors are used which are coupled to each other so that the second one is cut off when the first auxiliary transistor is switched into conduction, and vice versa. If the second auxiliary transistor is cut off, a so-called bootstrap capacitor is charged up from a fixed voltage. When this second auxiliary transistor is switched into conduction, the bootstrap capacitor can discharge and charges the gate-source capacitance of the FET to the required control voltage and makes the latter conduct. The bipolar auxiliary transistors are connected to practically the same voltage as the FET.

The development of power FETs also leads to their use for higher voltages, such as 100 V or more. Thus auxiliary transistors which can block higher voltages are also needed.

It is accordingly an object of the invention to provide a switch with an MIS-FET operated as a source follower, which overcomes the hereinafore-mentioned disadvantages of the heretofore-known devices of this general type, and in such a manner that auxiliary transistors can be used which can only block relatively low voltages.

With the foregoing and other objects in view there is provided, in accordance with the invention, a switch, comprising an MIS-FET having a source and a gate or gate electrode defining a control-source capacitance and being operated as a source follower for switching a given voltage, a first capacitor, a first auxiliary transistor, a second auxiliary transistor cutting off the first transistor when switched into a conducting state, the transistors each having a base, a collector and an emitter electrode defining a switching path, the collectors of each of the transistors being connected to the control electrode of the FET, a control input terminal, second and third capacitors each being connected between the control input terminal and the base of a respective one of the transistors, the emitter electrode of the second transistor being connected to the source electrode of the FET, the first capacitor having one lead connected to the emitter electrode of the first transistor and to the source electrode of the FET for charging the gate-source capacitance of the FET through the switching path of the first transistor, and another lead connected to the emitter electrode of the first transistor and to a terminal of a voltage source having a lower voltage than the given voltage to be switched by the FET for charging the first capacitor when the first transistor is cut off.

In accordance with another feature of the invention, there is provided a diode connected between the other lead of the first capacitor and the terminal of the voltage source.

In accordance with a further feature of the invention, the first transistor is a pnp-transistor, the second transistor is an npn-transistor and the MIS-FET is of the n-channel type, or vice versa.

In accordance with an added feature of the invention, there is provided a first and a second diode each connected antiparallel between the emitter and the base, i.e. the emitter-base path, of each of the transistors.

In accordance with an additional feature of the invention, there is provided a first and a second resistor each shunted between the emitter and base, i.e. the emitter-base path, of each of the transistors.

In accordance with a concomitant feature of the invention, the MIS-FET includes a drain electrode, and there is provided another FET being of the same type or the first-mentioned FET and having a source, a drain and a control electrode, a load having terminals, and another input terminal, the drain electrode of the other FET being connected to the source electrode of the first-mentioned FET, the drain electrode of the first-mentioned FET being connected to a positive potential and the source electrode of the other FET being connected to a negative potential, with respect to the source electrodes, the source electrode of the first-mentioned FET and the drain electrode of the other FET being connected to one of the terminals of the load, the control electrode of the other FET being connected to the first-mentioned input terminal, and the source electrode of the other FET being connected to the other input terminal, i.e. the source forms the other input terminal.

Other features which are considered as characteristic for the invention are set forth in the appended claims.

Although the invention is illustrated and described herein as embodied in a switch with an MIS-FET operated as a source follower, it is nevertheless not intended to be limited to the details shown, since various modifications and structural changes may be made therein without departing from the spirit of the invention and within the scope and range of equivalents of the claims.

Figure 2:
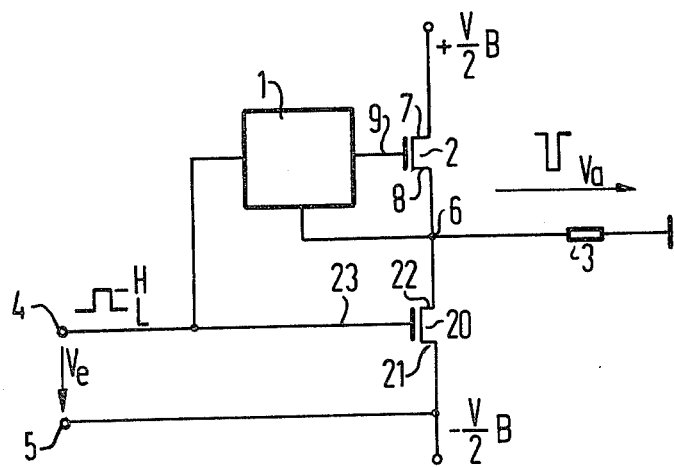

The construction and method of operation of the invention, however, together with additional objects and advantages thereof will be best understood from the following description of specific embodiments when read in connection with the accompanying drawings, in which:

FIG. 1 is a schematic circuit diagram of an on-off switch of a first embodiment of the invention; and FIG. 2 is a schematic circuit diagram and diagrammatic view of a double-throw switch according to a second embodiment of the invention, developed from the switch according to FIG. 1.

Referring now to the figures of the drawing and first particularly to FIG. 1 thereof, it is seen that the switch shown therein substantially includes a control section 1 and a power MIS-FET 2 (metal-isolated semiconductor field-effect transistor) which is connected to a supply voltage $+V_B$ in series with a load 3. The load is connected between the source electrode 8 of the FET and ground. The FET 2 is therefore operated as a so-called source-follower. Such switches can advantageously be used, for instance, for throttle converters. The control section 1 of the switch, which is framed by a dot-dash line in FIG. 1, has two mutually complementary auxiliary transistors 11 and 12. If the FET 2 is of the n-channel type, the auxiliary transistor 11 is a pnp-transistor and the auxiliary transistor 12 is an npn-transistor. When using a p-channel FET, the auxiliary transistors would be of the npn-and pnp-type, respectively. The auxiliary transistor 12 is shunted across the gate-source path of the FET 2, which is characterized by the gate-source capacitor 10. The capacitor 10 is further shunted by a series circuit including the collector-emitter path of the auxiliary transistor 11 and a bootstrap capacity 14. One lead of this capacitor 14 is furthermore connected through a diode 13 to an auxiliary voltage source having a voltage $+V_h$. This auxiliary voltage may be, for instance, 10 V while the supply voltage $+V_B$ can be around 50 to 100 V or higher. The other lead of the capacitor 14 is connected to the source electrode 8 of the FET 2. The drain electrode 7 is connected to a positive voltage. The control electrodes or bases of both auxiliary transistors 11, 12 are connected to each other through capacitors 17, 18. The junction point is the input terminal 4 of the switch; depending on the property of the voltage source, a resistor 19 may be further inserted. The second input terminal of the switch is designated with reference character 5. The terminal 5 is connected to ground. To eliminate the directional effect of the emitter-base paths of the auxiliary transistors 11 and 12, these can be shunted by antiparallel-connected diodes 15, 16. These diodes may also be replaced by resistors.

To explain the operation of the switch, it will first be assumed that the bootstrap capacitor 14 is charged with the polarity indicated by the auxiliary voltage $V_h$. Then, the control voltage $V_e$ at the terminals 4 and 5 is lowered from the level H to the level L. A negative control pulse which opens the auxiliary transistor 11 is therefore fed to the base terminal of the auxiliary transistor 11 through the capacitor 17. The capacitor 14 can then discharge and charge the capacitor 10 through the emitter-collector path of the auxiliary transistor 11. The FET 2 therefore begins to conduct and the potential at point 6 rises. At the same time, the potential at the control electrode 9 of the FET 2 is increased while the discharge of the capacitor 14 lasts until capacitor 10 is charged. For this purpose, the capacitor 14 must be larger than the capacitor 10. Simultaneously with the process of the auxiliary transistor 11 becoming conducting, the auxiliary transistor 12 is cut off by the same negative pulse. The auxiliary transistor 12 remains cut off if it should already have been cut off due to the decay of a positive capacitive control current. A discharge of the capacitor 10 through this auxiliary transistor is thus avoided. The FET 2 now remains open as long as the capacitor 10 is charged with a voltage which is above the set-in voltage of the FET.

To switch off the FET, the level of the input voltage $V_e$ is increased to the value H. The base electrode of the auxiliary transistor 12 thus receives a positive voltage pulse which opens the auxiliary transistor 12. The positive voltage pulse simultaneously causes the pnp-transistor 11 to be cut off. The auxiliary transistor 11 also remains cut off if it has already been cut off by the decay of a negative capacitive control current. The capacitor 10 is therefore discharged and the FET can cut off. The potential at point 6 then drops so far that the capacitor 14 can be charged up again through the diode 13 by the auxiliary voltage source.

It is seen from the above explanation of the operation that maximally the control voltage of the FET 2, i.e. the auxiliary voltage $V_h$ less the threshold voltage of the diode 13, is present at the auxiliary transistor 12, which is the residual collector-emitter voltage of the transistor 11. On the other hand, only the control voltage of the FET 2, which corresponds substantially to the auxiliary voltage $V_h$ less the threshold voltage of the diode 13, is present in the cut-off state at the auxiliary transistor 11.

With the circuit construction thus explained, it is possible to switch the FET 2 fast, since a feedback is obtained by the hereinafore-described interconnection of the two auxiliary transistors 11 and 12: Upon closing the switch, i.e. when the control voltage $V_e$ jumps to the level L, a voltage rise at the emitter of the auxiliary transistor 11 occurs due to the potential rise at the point 6, in addition to the negative control pulse at the auxiliary transistor 11. This transistor is therefore switched on in an accelerated manner. The potential rise at the point 6 also quickly cuts off the auxiliary transistor 12 by biasing its emitter so as to be positive relative to the base. When the input voltage $V_e$ jumps to the level H, the switching-off of the auxiliary transistor 11 and the switching-on of the auxiliary transistor 12 are accelerated. Therefore the FET 2 can be cut off very fast.

In FIG. 2 there is shown a double-throw switch, with which the load 3 can be alternatingly switched to a positive voltage $+\frac{1}{2} V_B$ and to a negative voltage $-\frac{1}{2} V_B$. For this purpose, the switch according to FIG. 1 is supplemented by a second FET 20 of the same channel type. The source terminal of the FET 20 is designated with reference character 21, its drain terminal with reference character 22 and its gate or control terminal with reference character 23. The source terminal 8 of the first FET 2 and the drain terminal 22 of the second FET 20 are tied together. The junction point 6 is further connected to a terminal of the load and to the control circuit 1. The gate terminal 23 of the FET 20 is connected to the first input terminal 4, while the source terminal 21 in practice forms the second terminal 5.

The FET 2 is switched-on by letting the input voltage go from the level H to the level L, as described in connection with FIG. 1. Therefore, the FET 20 is cut off and the load is connected to a positive voltage of the magnitude $+\frac{1}{2} V_B$. When the input voltage jumps to the level H, the FET 2 is cut off as described in connection with FIG. 1. The gate electrode 23 of the FET 20 now receives a positive voltage relative to the point 6 and the FET 20 is switched on. A negative voltage of magnitude $-\frac{1}{2} V_B$ is then present at the load 3.

There is claimed:

1. Switch, comprising an MIS-FET having a source and a control electrode defining a gate-source capacitance and being operated as a source follower for switching a given voltage; a first capacitor; a first auxiliary transistor; a second auxiliary transistor cutting off said first transistor when switched into a conducting state; said transistors each having a base, a collector and an emitter electrode defining a switching path; the collectors of each of said transistors being connected to the control electrode of said FET; a control input terminal; and second and third capacitors each being connected between said control input terminal and the bases of said first and second transistors, respectively; the emitter electrode of said second transistor being connected to the source electrode of said FET; said first capacitor having one lead connected to the emitter electrode of said second transistor and to the source electrode of said FET for charging the gate-source capacitance of said FET through the switching path of the first transistor, and another lead connected to the emitter electrode of said first transistor and to a terminal of a voltage source having a lower voltage than the given voltage to be switched by said FET for charging said first capacitor when said first transistor is cut off.

2. Switch according to claim 1, including a diode connected between said other lead of said first capacitor and said terminal of said voltage source.

3. Switch according to claim 1 or 2, wherein said first transistor is a pnp-transistor, said second transistor is an npn-transistor and said MIS-FET is of the n-channel type.

4. Switch according to claim 1 or 2, wherein said first transistor is an npn-transistor, said second transistor is a pnp-transistor and said MIS-FET is of the p-channel type.

5. Switch according to claim 1, including a first and a second diode each connected antiparallel between the emitter and the base of each of said transistors.

6. Switch according to claim 1 or 5, including a first and a second resistor each shunted between the emitter and base of each of said transistors.

7. Switch according to claim 1, wherein said MIS-FET includes a drain electrode; and including another FET being of the same type as said first-mentioned FET and having a source, a drain and a control electrode; a load having terminals; and another input terminal; the drain electrode of said other FET being connected to the source electrode of said first mentioned FET; the drain electrode of said first-mentioned FET being connected to a positive potential and the source electrode of said other FET being connected to a negative potential; with respect to the source electrodes, the source electrode of said first-mentioned FET and the drain electrode of said other FET being connected to one of the terminals of said load, the control electrode of said other FET being connected to said first-mentioned input terminal, and the source electrode of said other FET being connected to said other input terminal.

* * * * *